(12) United States Patent
Chang et al.

(10) Patent No.: US 10,277,253 B2
(45) Date of Patent: Apr. 30, 2019

(54) HIGH PERFORMANCE DATA REDUNDANCY AND FAULT TOLERANCE

(71) Applicant: PhazrIO Inc., Los Angeles, CA (US)

(72) Inventors: Donald C. D. Chang, Thousand Oaks, CA (US); Chi-Kwan J. Cheung, Santa Monica, CA (US); Lara Dolecek, Los Angeles, CA (US); Gary N. Jin, Portland, OR (US); Rocky Chi-Ray Lin, Rowland Heights, CA (US)

(73) Assignee: PhazrIO Inc., Los Angeles, CA (US)

( * ) Notice: Subject to any disclaimer, the term of this patent is extended or adjusted under 35 U.S.C. 154(b) by 43 days.

(21) Appl. No.: 15/499,664

(22) Filed: Apr. 27, 2017

(65) Prior Publication Data

US 2018/0175887 A1 Jun. 21, 2018

Related U.S. Application Data

(60) Provisional application No. 62/437,467, filed on Dec. 21, 2016.

(51) Int. Cl.
*H03M 13/15* (2006.01)
*H03M 13/00* (2006.01)
*G06F 11/08* (2006.01)

(52) U.S. Cl.
CPC .......... *H03M 13/154* (2013.01); *G06F 11/08* (2013.01); *H03M 13/616* (2013.01)

(58) Field of Classification Search
CPC .......... H03M 13/154; H03M 13/6516; H03M 13/0619; H03M 13/064; H03M 13/0604; H03M 13/0644; H03M 13/616; G06F 11/1076; G06F 11/1088; G06F 11/1084; G06F 11/08

See application file for complete search history.

(56) References Cited

U.S. PATENT DOCUMENTS

| | | |
|---|---|---|
| 9,116,833 B1 | 8/2015 | Rakitzis et al. |
| 9,489,252 B1 | 11/2016 | Donlan |
| 2013/0173996 A1 | 7/2013 | Anderson et al. |
| 2015/0033070 A1* | 1/2015 | Ma ................ G06F 11/1088 714/6.24 |
| 2017/0063397 A1* | 3/2017 | Richardson ......... H03M 13/154 |
| 2017/0187398 A1* | 6/2017 | Trusov .............. H03M 13/6516 |
| 2018/0095665 A1* | 4/2018 | Xu ....................... G06F 3/0604 |

* cited by examiner

*Primary Examiner* — Shelly A Chase
(74) *Attorney, Agent, or Firm* — Shun Yao; Park, Vaughan, Fleming & Dowler LLP

(57) ABSTRACT

One embodiment provides a system that facilitates numerical operation-based erasure coding. During operation, the system determines the bit-width of processing capability of the computing system. The system then determines, based on the bit-width, a number of bits for representing a respective data element from a data stream and a number of data elements based on a number of a dimension of a generator matrix of erasure encoding. The system then obtains the number of data elements from the data stream and converts a respective obtained data element to a corresponding numerical representation. Here, a respective obtained data element is represented by the determined number of bits. The system then generates a code word, which comprises a plurality of coded fragments, of erasure encoding from the numerical representations based on the generator matrix of the erasure encoding.

20 Claims, 11 Drawing Sheets

HIGH PERFORMANCE DATA REDUNDANCY AND FAULT TOLERANCE

This application claims the benefit at U.S. Provisional Application No. 62/437,467, titled "High Performance Data Redundancy and Fault Tolerance Operations Using Numerics," by inventors Donald C. D. Chang, Chi-Kwan J. Cheung, Lara Dolecek, Gary N. Jin, and Rocky Chi-Ray Lin, filed 21 Dec. 2016, the disclosure at which is incorporated by reference herein.

BACKGROUND

Field

This disclosure is generally related to efficient data redundancy. More specifically, this disclosure is related to a method and system for facilitating high performance erasure-coding-based data redundancy and fault tolerance.

Related Art

With the advancement of the computer and network technologies, various operations performed by users of different applications have led to extensive use of web services. This proliferation of the Internet and Internet-based user activity continues to create a vast amount of digital data. For example, users may both generate and access data via different applications, such as mobile applications running on different platforms, as well as web-interfaces running on different browsers in different operating systems. For example, users may also use different social media outlets to access their uploaded images.

To ensure safety, typically multiple copies of such data are stored in the cloud (e.g., in a large storage system in a data center). For example, a large storage system relies on making at least three copies of the data in separate physical locations (e.g., in separate physical devices). This process of replication ensures high availability. To improve storage efficiently and reliability, high availability to data is often provided using erasure coding. Storage systems based on erasure coding (which can be referred to as erasure-coded systems) can provide higher tolerances of failure incidents than typical replication-based techniques while using less storage. Erasure codes, such as Reed-Solomon codes, are commonly used today in large storage systems for improved performance.

A vast majority of the erasure codes in commercial use are implemented as sets of linear equations using Galois fields. Galois fields arithmetic is computationally complex and may take longer to compute than simple numerical operations. This complexity reduces the encoding and decoding performance, leading to reduction of throughput of the storage systems. As a result, deployment of erasure coding is typically limited to archival data.

Although erasure coding is available for efficient storage, some problems still remain in the deployment of erasure coding for data streams.

SUMMARY

One embodiment provides a system that facilitates numerical operation-based erasure coding. During operation, the system determines the bit-width of the processing capability of the computing system. The system then determines, based on the bit-width, a number of bits for representing a respective data element from a data stream and a number of data elements based on a number of a dimension of a generator matrix of erasure encoding. The system then obtains the number of data elements from the data stream and converts a respective obtained data element to a corresponding numerical representation. Here, a respective obtained data element is represented by the determined number of bits. The system then generates a code word, which comprises a plurality of coded fragments, of erasure encoding from the numerical representations based on the generator matrix of the erasure encoding.

In a variation on this embodiment, the dimensions of the generator matrix indicate a number of the coded fragments in the code word and a minimum number of the coded fragments needed to recover the data elements.

In a variation on this embodiment, the numerical representation and the generator matrix include one or more complex numbers in a format composed of real and imaginary parts.

In a variation on this embodiment, the system allocates a number of numerical padding bits of a respective data element for overflow (e.g., for numerical padding). The allocated bits are not from the data stream.

In a further variation, allocating the number of bits includes determining a maximum of summation values of a respective row or a respective column of the generator matrix, and determining that the allocated bits can represent a value greater than or equal to the maximum of the summation values.

In a further variation, the system converts the numerical representation based on a computational capability of the computing system. The computational capability indicates which type of numerical value the computing system is most capable of computing.

In a variation on this embodiment, generating the code word includes representing the numerical representations as a data matrix and multiplying the data matrix with the generator matrix.

In a further variation, the system determines one or more methods of parallelism for the multiplication operation. The data matrix is represented as a vectorized data structure.

In a variation on this embodiment, the system determines a sub-matrix of the generator matrix based on a minimum number of the coded fragments needed to recover the data elements. The system then retrieves the minimum number of coded fragments of the code word from distributed storage devices, obtains the numerical representations from the retrieved coded fragments based on an inverted matrix of the sub-matrix, and obtains the data elements from the numerical representations.

In a further variation, the system discards padding bits from the data elements obtained from the numerical representations.

In a further variation, the system decodes the data elements to retrieve data of the data stream.

In a variation on this embodiment, the system identifies one or more unavailable coded fragments and the remaining coded fragments that are available. The system determines a sub-matrix of the generator matrix based on a minimum number of the remaining coded fragments needed to recover the unavailable coded fragments. The system then recovers, at the same time, all of the unavailable coded fragments based on an inverted matrix of the sub-matrix and indices of the unavailable coded fragments, thereby avoiding recovery of one unavailable coded fragment at a time.

In a further variation, the system determines a second sub-matrix of the generator matrix based on a minimum number of the coded fragments needed to recover the data elements. The system then retrieves the minimum number of coded fragments of the code word from the recovered coded fragments and the remaining coded fragments, obtains the numerical representations from the retrieved coded fragments based on an inverted matrix of the sub-matrix, and obtains the data elements from the numerical representations.

In a variation on this embodiment, the numerical representation of a data element is obtained based on one or more of: a frequency, amplitude, or phase domain representation of the data element, and a mathematical operation that associates the corresponding domain representation to a function of time.

In a variation on this embodiment, the erasure encoding includes operations over non-finite field arithmetic.

BRIEF DESCRIPTION OF THE FIGURES

In the figures, like reference numerals refer to the same figure elements.

DETAILED DESCRIPTION

Figure 1A:
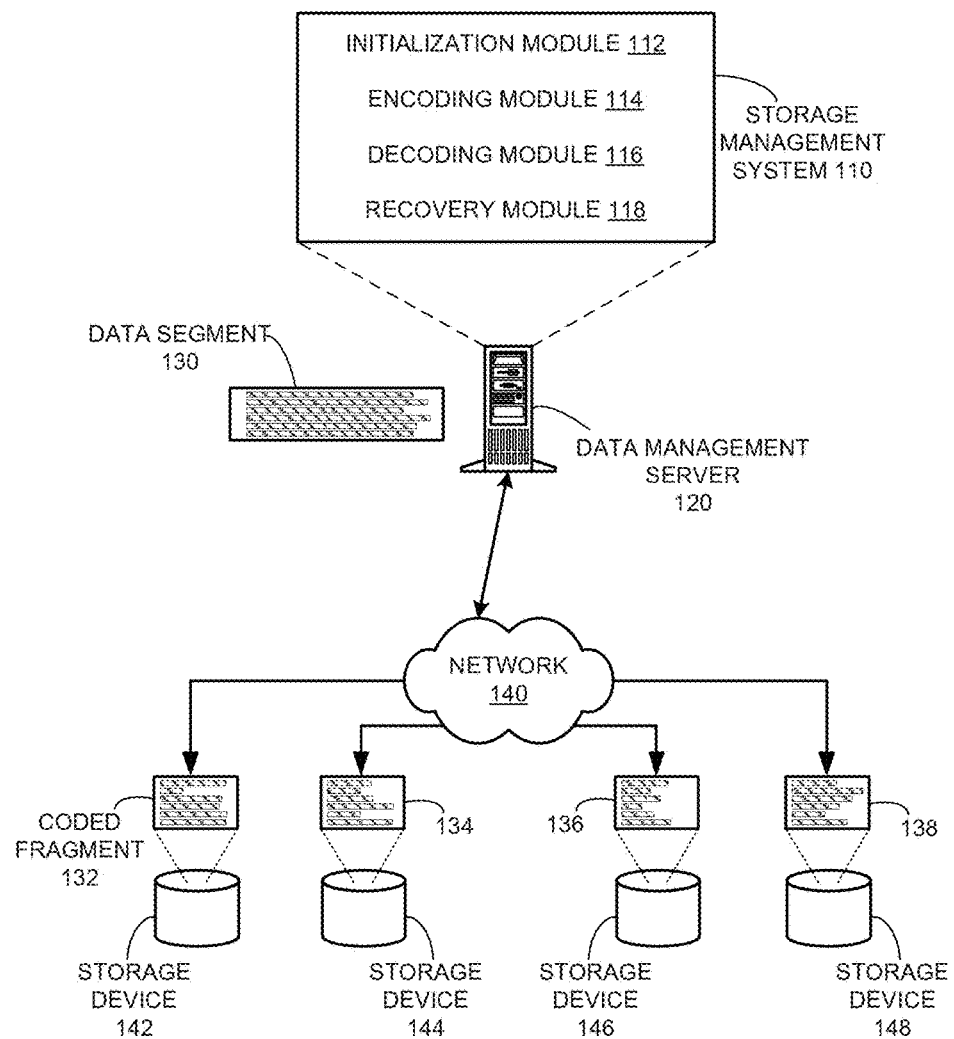
FIG. 1A illustrates an exemplary storage management system with efficient erasure-coding support, in accordance with an embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a system, which performs numerical operation-based erasure coding to facilitate high availability to data streams. Due to ease of access via the Internet, a large number of users generate and access digital data. To ensure high availability of data, typically multiple of copies of such data are stored in a storage system. If one copy of the data becomes unavailable (e.g., the storage device storing the copy fails), the system can still provide the data to the user from another copy of the data.

With existing technologies, erasure coding can be used to provide high availability with a lower storage requirement than typical replication-based techniques. Erasure coding performs encoding on the data to generate a number of coded fragments. A subset of the coded fragments can be used to retrieve the original data. As a result, even if one of the coded fragments becomes unavailable, the system can still retrieve the original data. For example, in a (6,4) erasure-coding-based storage system, the original data is encoded into 6 coded fragments. The system can use any 4 of the coded fragments to retrieve the original data.

However, since erasure coding requires computation on the data during storage and access, erasure-coding-based storage systems are usually slower than traditional replication-based systems. Furthermore, even with specialized hardware instructions (e.g., an Operational Code or OpCode) for computing erasure codes, such systems are still slower than replication-based systems. As a result, erasure-coding-based systems may not be suitable for data streams (which can be referred to as live or hot data) and are typically used for archival purposes (which can be referred to as cold data).

To solve this problem, embodiments of the present invention provide a system that facilitates numerical operation-based erasure coding to hot data streams. Conventional approaches, such as Galois field arithmetic, may require significantly longer to compute than simple numerical operations, such as XOR functions, mix column, byte substitution, and bit-shifting. Therefore, the system uses numerical operations to efficiently perform encoding and decoding, and makes an erasure-coding-based approach suitable for data streams.

During operation, the system uses numerical operations instead of Galois field arithmetic to encode the data stream. The system obtains a number of bits from the data stream as a data element and represents the data element in a numerical representation. The system then forms a data matrix comprising a plurality of such data elements in corresponding numerical representations and determines a generator matrix for the data matrix. In some embodiments, the system multiplies the data matrix and the generator matrix to generate the coded fragments.

The system can use a subset of coded fragments and a corresponding decoder matrix to retrieve the data elements. The decoder matrix corresponds to the sub-matrix (i.e., the portion of the generator matrix) that has been used to generate the subset of coded fragments. If one or more of the coded fragments become unavailable (e.g., becomes corrupted), the system uses a subset of coded fragments to reconstruct the corrupted coded segments based on a recovery matrix. It should be noted that the decoder matrix and recovery matrix can be obtained from inversing the corresponding sub-matrix of the generator matrix.

In this way, the system facilitates write, read, and fault tolerance capabilities of a storage system using matrix operations. Erasure code implementation using numerical types (e.g., integers, doubles, big integer, floating points, decimal floating points, etc.), instead of using a Galois field lookup matrix, allows for significantly higher processing speed for erasure coding.

Storage Management System

FIG. 1A illustrates an exemplary storage management system with efficient erasure coding support, in accordance with an embodiment of the present invention. In this example, a data management server 120 is coupled with a network 140. Server 120 can be a physical or a virtual device. Network 140 can be a local or a wide area network, or the Internet. Network 140 can also be a data center network operating in a data center distributed across one or more geographic locations. Server 120 hosts a storage management system 110, which performs erasure coding to facilitate high availability to data streams.

Erasure coding can be systematic and non-systematic. Systematic erasure codes store original data bits separately from parity bits. The data bits are in plain text and can be accessed without decoding. The parity bits are used to recover the original data bits in an event of data corruption. On the other hand, non-systematic erasure codes combine original data and parity data as encoded bits. This provides implicit data security by avoiding data in plain text. Non-systematic erasure codes are generally slower than systematic codes for access operations.

With existing technologies, system 110 may use Galois field arithmetic to encode archival data. Suppose that server 120 facilitates specialized hardware instructions for computing erasure codes. Examples of such instructions include, but are not limited to, Single Instruction Multiple Data (SIMD) and Advanced Vector Extensions, such as AVX, AVX2, etc. These instructions can allow server 120 to manipulate large data vectors with a smaller number of instructions and accelerate computation associated with Galois field arithmetic. However, even with such hardware support, system 110 may still operate more slowly than traditional replication-based systems. As a result, system 110 may not be suitable for data streams and may be limited to archival data.

To solve this problem, system 110 facilitates numerical operation-based erasure coding to data streams. Instead of relying on Galois field arithmetic, system 100 uses simple numerical operations, such as XOR functions, mix column, byte substitution, and bit-shifting, to perform erasure coding. In some embodiments, system 110 can include an initialization module 112, an encoding module 114, a decoding module 116, and a recovery module 118. Using these modules, system 110 facilitates write, read, and fault tolerance capabilities of a storage system using matrix operations. Erasure code implementation using numerical types (e.g., integers, doubles, big integer, floating points, decimal floating points, etc.), instead of using a Galois fields lookup table, allows system 110 to significantly speed up the erasure coding process.

During operation, initialization module 112 determines the bit-width of the processing capacity of server 120. Based on the determination, initialization module 112 determines the number of bits in a data element. For example, if initialization module 112 determines that server 120 includes a 64-bit processor, initialization module 112 determines that a data element should include 64 bits. Since Galois field arithmetic is typically executed on 8 bits at a time, processing 64 bits at a time can significantly increase the encoding process.

Encoding module 114 obtains a data element of the determined bit-length from data segment 130 of a data stream. Encoding module 114 then represents the data element in a numerical representation. In this way, encoding module 114 obtains a plurality of data elements from data segment 130 and forms a data matrix comprising the plurality of data elements in corresponding numerical representations. Encoding module 114 also determines a generator matrix for the data matrix. In some embodiments, encoding module 114 multiplies the data matrix and the generator matrix to generate a plurality of coded fragments 132, 134, 136, and 138.

A storage system can distribute coded fragments 132, 134, 136, and 138 via network 140 and store them in storage devices 142, 144, 146, and 148, respectively. It should be noted that storage devices 142, 144, 146, and 148 can be in the same location or in different geographic locations. Storage device 142 can indicate the portion of cloud storage (e.g., 5 gigabytes of storage) dedicated for the user on the storage devices of cloud provider 122. Coded fragments 132, 134, 136, and 138 can also be stored in a same storage device. Examples of a storage device include, but are not limited to, a hard disk drive (HDD), a solid-state drive (SSD), and a flash memory.

Decoding module 116 can use a subset of coded fragments and a corresponding decoder matrix to retrieve the data elements. For example, if data segment 130 can be recovered from three coded fragments, decoding module 116 can use coded fragments 132, 134, and 136 to retrieve data segment 130. Under such a scenario, the decoder matrix can correspond to the sub-matrix that has been used to generate coded fragments 132, 134, and 136, and may not include the sub-matrix that has been used to generate coded fragment 138.

Suppose that storage device 142 becomes unavailable (e.g., due to a device or a network failure). As a result, coded fragment 132 also becomes unavailable. Recovery module 118 can use the available coded fragments 134, 136, and 138 to reconstruct the unavailable coded fragment 132 based on a recovery matrix. Under such a scenario, the recovery matrix can correspond to the sub-matrix that has been used to generate coded fragments 134, 136, and 138, and may not include the sub-matrix that has been used to generate coded fragment 132. It should be noted that the decoder matrix and recovery matrix can be obtained from inversing the corresponding sub-matrix of the generator matrix.

Numerical Representation

Figure 1B:
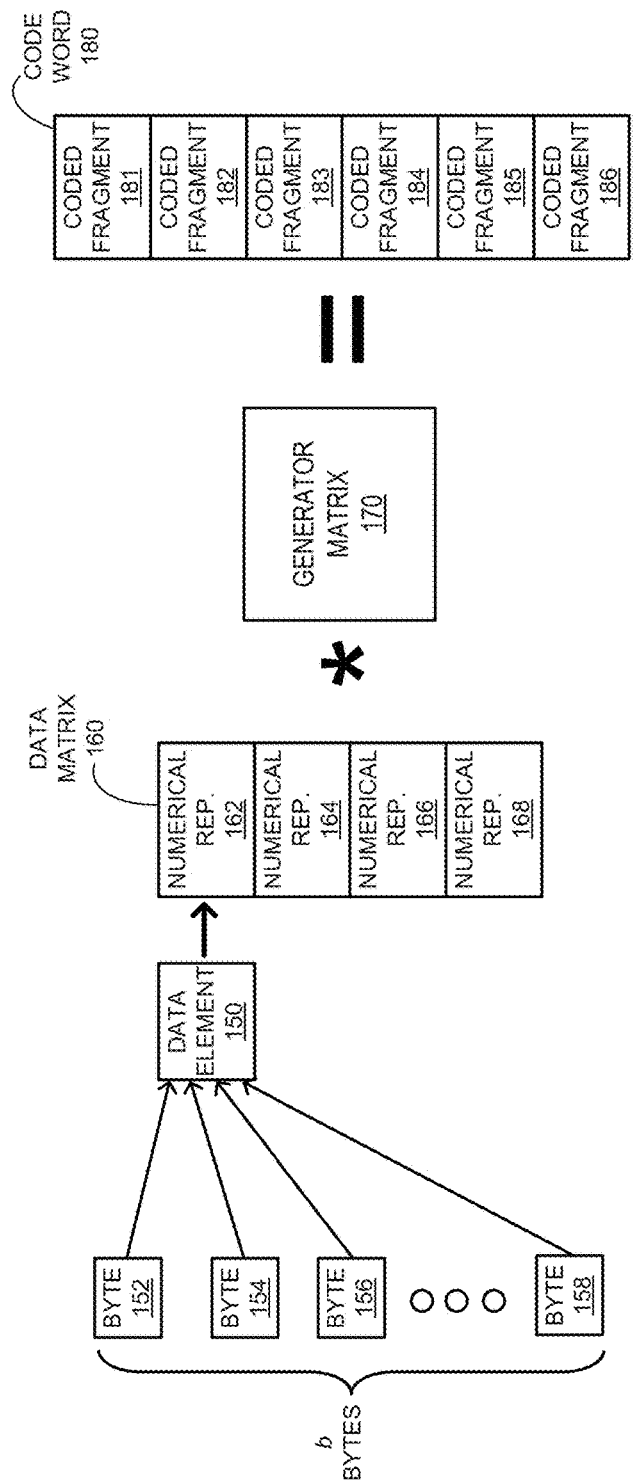
FIG. 1B illustrates exemplary numerical operation-based erasure coding, in accordance with an embodiment of the present invention.

FIG. 1B illustrates exemplary numerical operation-based erasure coding, in accordance with an embodiment of the present invention. During operation, a storage management system determines how many bits a data element should include. For example, if a computing device includes a 64-bit processor and/or includes a 64-bit bus, the system can determine to include 64 bits or 8 bytes in a data element. In this example, the system includes b bytes, comprising bytes 152, 154, 156, and 158, from a data stream in a data element 150.

The system then represents data element 150 in a numerical representation 162. For example, the system can convert the bits of data element 150 into a numerical data type. Such numerical data types can be a real number, an imaginary number, or a combination of real and imaginary numbers. In some embodiments, the system allocates a subset of bits of data element 150 as a set of padding bits to incorporate an overflow, if any, for the numerical operations performed on numerical representation 162. The system can determine an optimal number of padding bits based on the maximum value that an overflow resulting from the numerical operations on numerical representation 162 can take.

In the same way, the system generates numerical representations 164, 166, and 168. In some embodiments, generating the numerical representations includes one or more of: a frequency domain representation of the data element and the mathematical operation that associates the frequency domain representation to a function of time (e.g., a Fourier transformation of the data element); and a computation of amplitude and phase of the data element. The system includes the padding bits in the corresponding data elements associated with numerical representations 164, 166, and 168. The system forms a data matrix 160 comprising numerical representations 162, 164, 166, and 168. In some embodiments, the system arranges the converted numerical representations 162, 164, 166, and 168, and corresponding padding bits into a matrix representation (i.e., data matrix 160) in system memory and/or processor cache registers.

The system can also determine a generator matrix 170 based on the size of the data matrix and the number of coded fragments to be generated. In some embodiments, the number of matrix elements in data matrix 160 can be determined by the dimension of generator matrix 170 such that data matrix 160 and generator matrix 170 can be multiplied. For example, if the number of coded fragments to be generated is six and the minimum number of coded fragments needed to recover the data elements is four, generator matrix 170 should be a 6-by-4 matrix. Under such circumstances, the data matrix should be a 4-by-1 matrix. The system then multiplies data matrix 160 and generator matrix 170 to generate code word 180, which includes coded fragments 181, 182, 183, 184, 185, and 186. The system may use a subset of these coded fragments to recover the original data.

The system selects generator matrix 170 in such a way that the overflow resulting from the multiplication is relatively small (i.e., can be represented by the padding bits). In some embodiments, the overflow is less than or equal to the maximum of the respective summation of each row of generator matrix 170. The summation can be the summation of the elements of a row, wherein the number of elements in a row is equal to the number of columns in generator matrix 170.

This calculation may further be utilized to determine the minimum number of padding bits added to data element 150. The padding bits may vary depending on the input data size and number of fragments being generated. The fewer the padding bits, the more bits in data element 150 can be used to incorporate data from the data stream. For example, for a 64-bit computer, data element 150 can include 64 bits or 8 bytes. The system then can allocate seven bytes for data and one byte for padding bits. However, if the system determines that only four bits are needed to incorporate the overflow, the system can use an additional four bits to represent data. In some embodiments, only the data portion of data element 150 is represented in a numerical representation.

The multiplication between data matrix 160 and generator matrix 170 can include simple numerical operations, which are typically faster than linear arithmetic or table lookup operations used in Galois fields. Examples of numerical operations include, but are not limited to, addition, subtraction, multiplication, division, mix column, byte substitution, bit-shifting, and logical (AND, OR and XOR) operations. As a result, the numerical operation-based erasure coding uses fewer computing cycles, faster computation, and higher throughput for the storage systems.

Furthermore, a numerical representation can be more scalable. For example, Galois field operations are 8-bit operations while numerical representations can be 16, 32, 64, and 128 bits or more. As a result, numerical operation-based erasure coding results in higher speed and throughput. In addition, the system can use well-known techniques to optimize numerical operations associated with the matrix multiplication. Numerical operations can further benefit from hardware accelerations with vector instruction sets. If the computing system includes dedicated hardware support (e.g., Graphic Processing Units (GPU)), the system can select numerical data type and operations that can utilize such hardware.

Initialization, Encoding, Decoding, and Recovery

Figure 2:
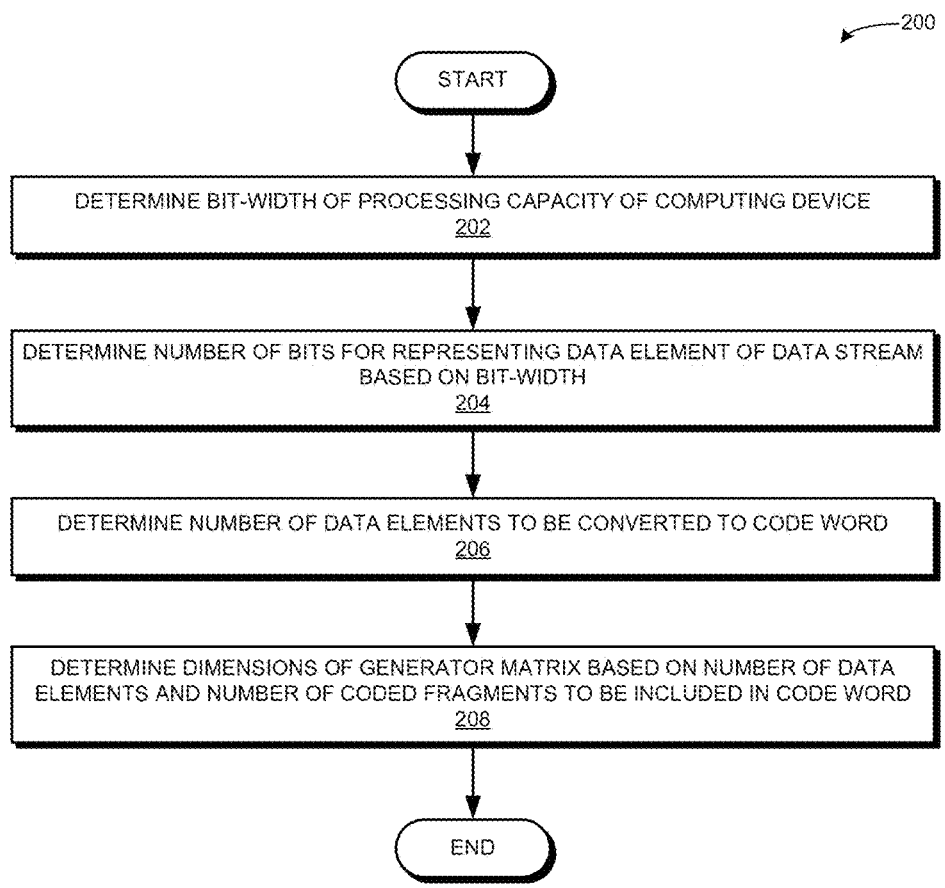
FIG. 2 presents a flowchart illustrating an initialization method for numerical operation-based erasure coding, in accordance with an embodiment of the present invention.

FIG. 2 presents a flowchart 200 illustrating an initialization method for numerical operation-based erasure coding, in accordance with an embodiment of the present invention. During operation, a storage management system determines the bit-width of the processing capacity of a computing device (operation 202). The system then determines a number of bits for representing a data element of the data stream based on the bit-width (operation 204). The system determines a number of data elements to be converted to a code word (operation 206) and determines dimensions of a generator matrix based on the number of data elements and the number of coded fragments to be included in a code word (operation 208).

Figure 3A:
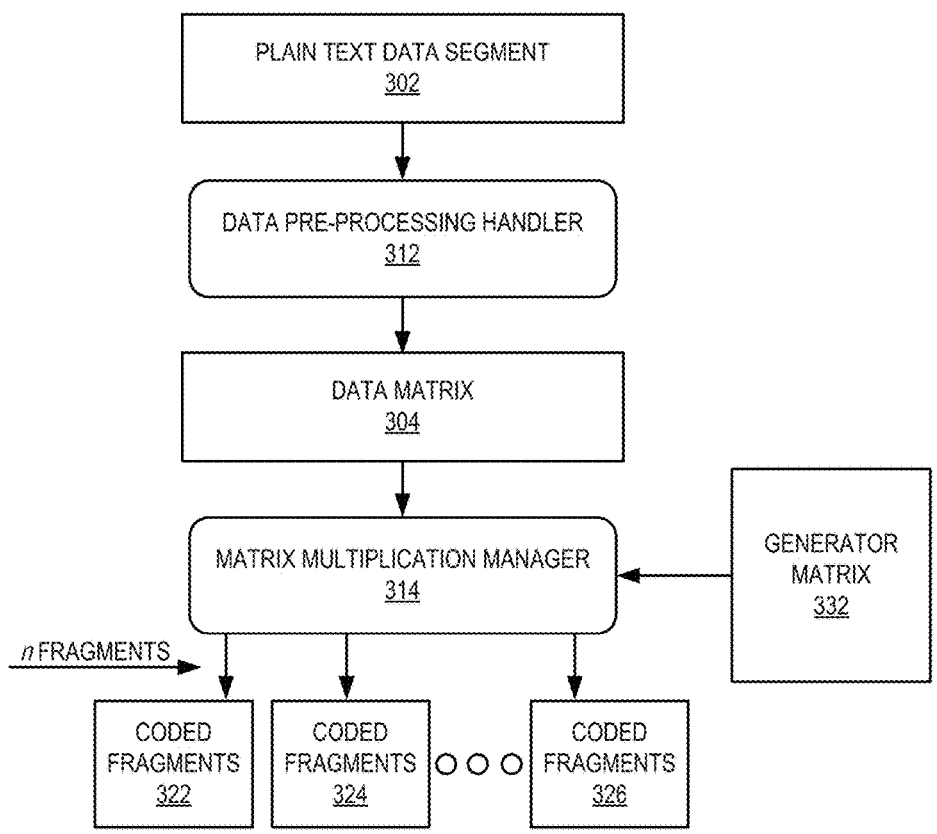
FIG. 3A illustrates an exemplary encoding process for numerical operation-based erasure coding, in accordance with an embodiment of the present invention.

FIG. 3A illustrates an exemplary encoding process for numerical operation-based erasure coding, in accordance with an embodiment of the present invention. During operation, a storage management system obtains plain text data segment 302 from a data stream. A data pre-processing handler 312 of the system converts the data into a data matrix, as described in conjunction with FIG. 1B. Handler 312 first converts the input plain text data segment 302 into numerical representation, which can include real numbers, imaginary numbers, or a combination of real and imaginary numbers. Handler 312 then determines and allocates the optimal number of padding bits and arranges the numerical representations and corresponding padding bits in a data matrix 304. Handler 312 also determines a generator matrix 332 based on the data size.

Handler 312 can generate generator matrix 332 deterministically based on a set of criteria, which include and are not limited to, the size of data matrix 304, the number of coded fragments to be generated (e.g., in the example in FIG. 3A, this number is n), a threshold for fault tolerance, and availability of a sparse inverse of a respective sub-matrix required for recovery and reconstruction. Generator matrix 332 can be preselected by a user of the system (e.g., an administrator) such that the above criteria are met. Generator matrix 332 can include real numbers, imaginary numbers, or both, with low numerical values to limit the overflow. In some embodiments, generator matrix 332 is designed in such a way that a multiplication between data matrix 304 and generator matrix 332 only requires additions, subtractions, byte substitution, and bit shift operations.

A matrix multiplication manager 314 multiplies data matrix 304 and generator matrix 332 to generate n coded fragments, which includes coded fragments 322, 324, and 326. In some embodiments, such erasure encoding includes operations over non-finite field arithmetic. The multiplication process includes multiplication between real numbers, imaginary numbers, or real and imaginary numbers. In some embodiments, an element in data matrix 304 or generator matrix 332 can be represented as a highly vectorized data structure. This allows high degrees of loop level parallelism (LLP) during the multiplication process. For example, multiple operations with matrix elements represented in highly vectorized data structures can be performed simultaneously. A computer processor usually can execute an instruction, which processes several operations simultaneously.

Furthermore, as described in conjunction with FIG. 1B, a respective data element of data matrix 304 is determined based on the bit-width of the processing capability (e.g., width of the bus) of a computing device. As a result, such simultaneous processing of the elements can occur over a wide data path (e.g., 64-bit, 128-bit, etc.). As a result, the matrix multiplication process can simultaneously process more data bits, leading to improved efficiency. Selection of the width of the data path and the size of a vectorized element may depend on the size of the data matrix and the generator matrix, operations associated with the matrix multiplication, etc.

Figure 3B:
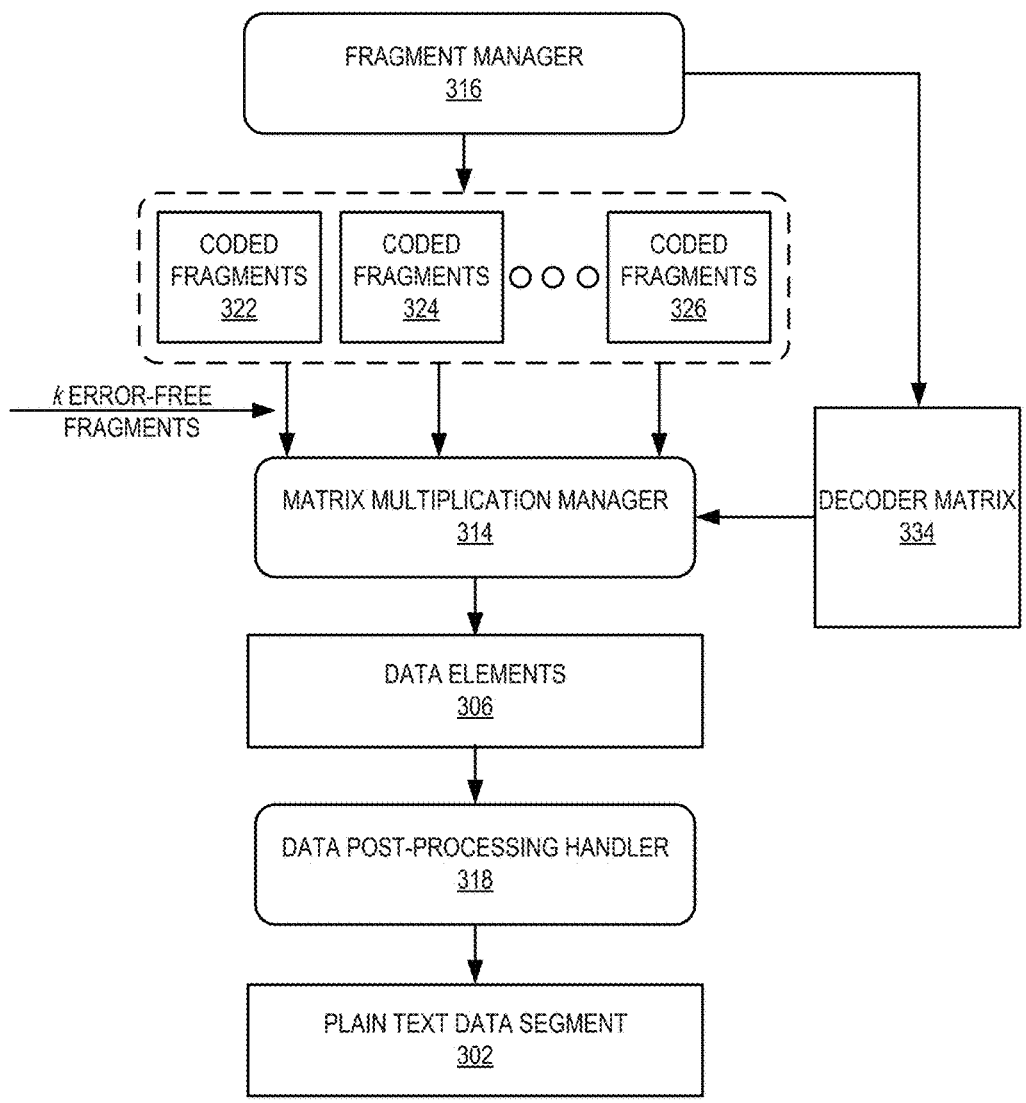
FIG. 3B illustrates an exemplary decoding process for numerical operation-based erasure coding, in accordance with an embodiment of the present invention.

FIG. 3B illustrates an exemplary decoding process for numerical operation-based erasure coding, in accordance with an embodiment of the present invention. During operation, a fragment manager 316 of a storage management system determines the minimum number of error-free coded fragments needed to retrieve the data elements. Suppose that the number of coded fragments is n and the minimum number of coded fragments needed to retrieve the data is k (wherein n>k). Fragment manager 316 then selects k error-free coded fragments from the n coded fragments. In the example in FIG. 3B, the n coded fragments includes coded fragments 322, 324, and 326. Criteria for selecting the k error-free coded fragments from the n coded fragments include, but are not limited to, one or more of: first available error-free fragments, data location, storage and network transfer speed, and system load.

Fragment manager 316 also determines an appropriate decoder matrix 334. Matrix elements of decoder matrix 334 can be real numbers. The matrix elements can also be fractions without repeating decimals that may cause rounding errors. Decoder matrix 334 can be fixed for generator matrix 332 and the selected k coded fragments. For different k coded fragments, the corresponding decoder matrix can be pre-calculated from generator matrix 332. When needed, fragment manager 316 can retrieve the decoder matrix corresponding to the selected k coded fragments. In some embodiments, decoder matrix 334 can use a uniform scalar numerical data to eliminate any calculation that may result in a floating point number. Decoder matrix 334 can be preselected by the user or generated by fragment manager 316.

Matrix multiplication manager 314 multiplies the selected k coded fragments, which can be represented as a coded matrix, with decoder matrix 334 to generate data elements 306. Data elements 306 can include numerical representation of the original data segment and additional padding bits. A data post-processing handler 318 of the system then removes the padding bits from data elements 306 and converts the numerical representations into plain text data segment 302. For example, if 8 padding bits are added to 120 bits of numerical representation to create a 128-bit-wide data block during the encoding process, handler 318 removes the 8 padding bits and converts the numerical representation in the remaining 120 bits into a corresponding plain text data segment.

Figure 3C:
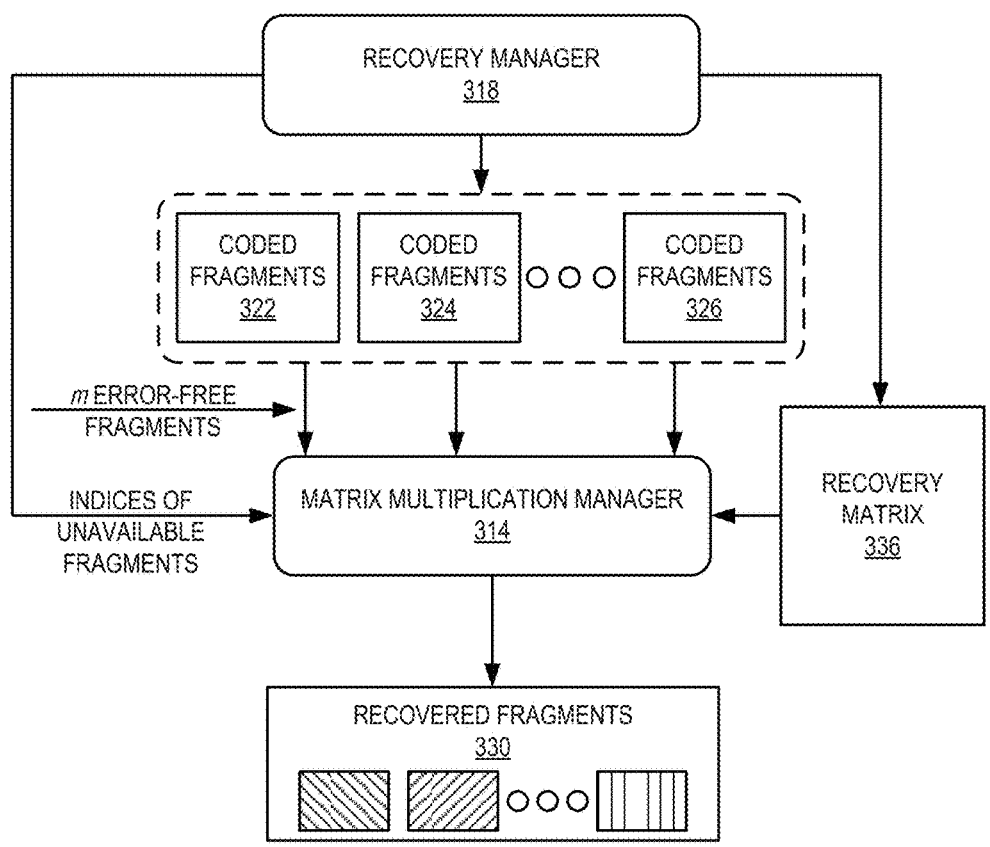
FIG. 3C illustrates an exemplary recovery process for numerical operation-based erasure coding, in accordance with an embodiment of the present invention.

FIG. 3C illustrates an exemplary recovery process for numerical operation-based erasure coding, in accordance with an embodiment of the present invention. During operation, a recovery manager 318 of a storage management system determines that one or more of the n coded fragments are unavailable. Recovery manager 318 can use well-known methods of integrity checks in a distributed storage system (e.g., a hash-based verification technique). Recovery manager 318 then determines the minimum number of error-free coded fragments needed to recover the unavailable coded fragments. In the example in FIG. 3C, the minimum number is m. Recovery manager 318 selects m coded fragments from the remaining coded fragments needed to recreate the unavailable coded fragments.

Recovery manager 318 obtains a recovery matrix 336 by inverting a sub-matrix, which corresponds to the selected m coded fragments, of generator matrix 332. Matrix multiplication manager 314 then multiplies the selected m coded fragments and recovery matrix 336 to reconstruct the recovered coded fragments 330. Matrix multiplication manager 314 uses the indices of the unavailable coded fragments to determine which of the recovered coded fragments are the unavailable coded fragments. It should be noted that this matrix multiplication can recover all unavailable coded fragments. In this way, the embodiments of the present invention can avoid a repeated recovery process for individual unavailable coded fragments.

Operations

Figure 4A:
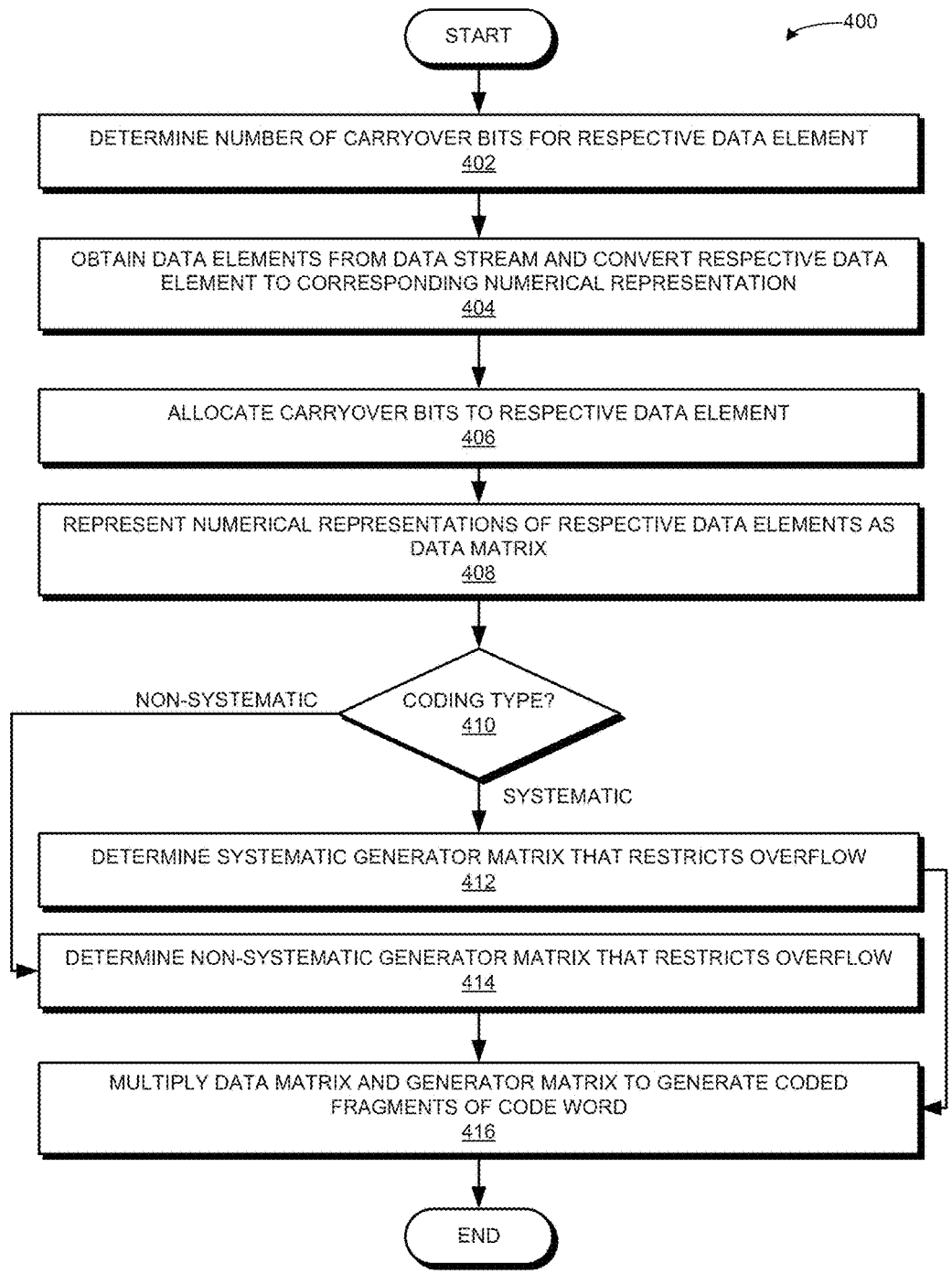
FIG. 4A presents a flowchart illustrating a method for encoding data elements using numerical operation-based erasure coding, in accordance with an embodiment of the present invention.

FIG. 4A presents a flowchart 400 illustrating a method for encoding data elements using numerical operation-based erasure coding, in accordance with an embodiment of the present invention. During operation, a storage management system determines the number of padding bits for a respective data element (operation 402). The system can determine the minimum number of padding bits needed to represent overflow. The system obtains data elements from the data stream and converts a respective data element to a corresponding numerical representation (operation 404). The system then allocates padding bits to respective converted data element (operation 406). For example, if the system has allocated 64 bits for each data element and determines the number of padding bits to be 8, the system obtains 56 bits of data element from the data stream, converts the data element to a numerical representation, and allocates the remaining 8 bits as padding bits for the data element.

The system represents the numerical representations of respective data elements as a data matrix (operation 408). The system checks a coding type (operation 410). If the coding type is systematic erasure coding, the system determines a systematic generator matrix that restricts overflow (e.g., to the allocated bits) (operation 412). If the coding type is non-systematic erasure coding, the system determines a non-systematic generator matrix that restricts overflow (e.g., to the allocated bits) (operation 414). Upon determining the generator matrix (operation 412 or 414), the system multiplies the data matrix and the generator matrix to generate coded fragments of the code word (operation 416).

Figure 4B:
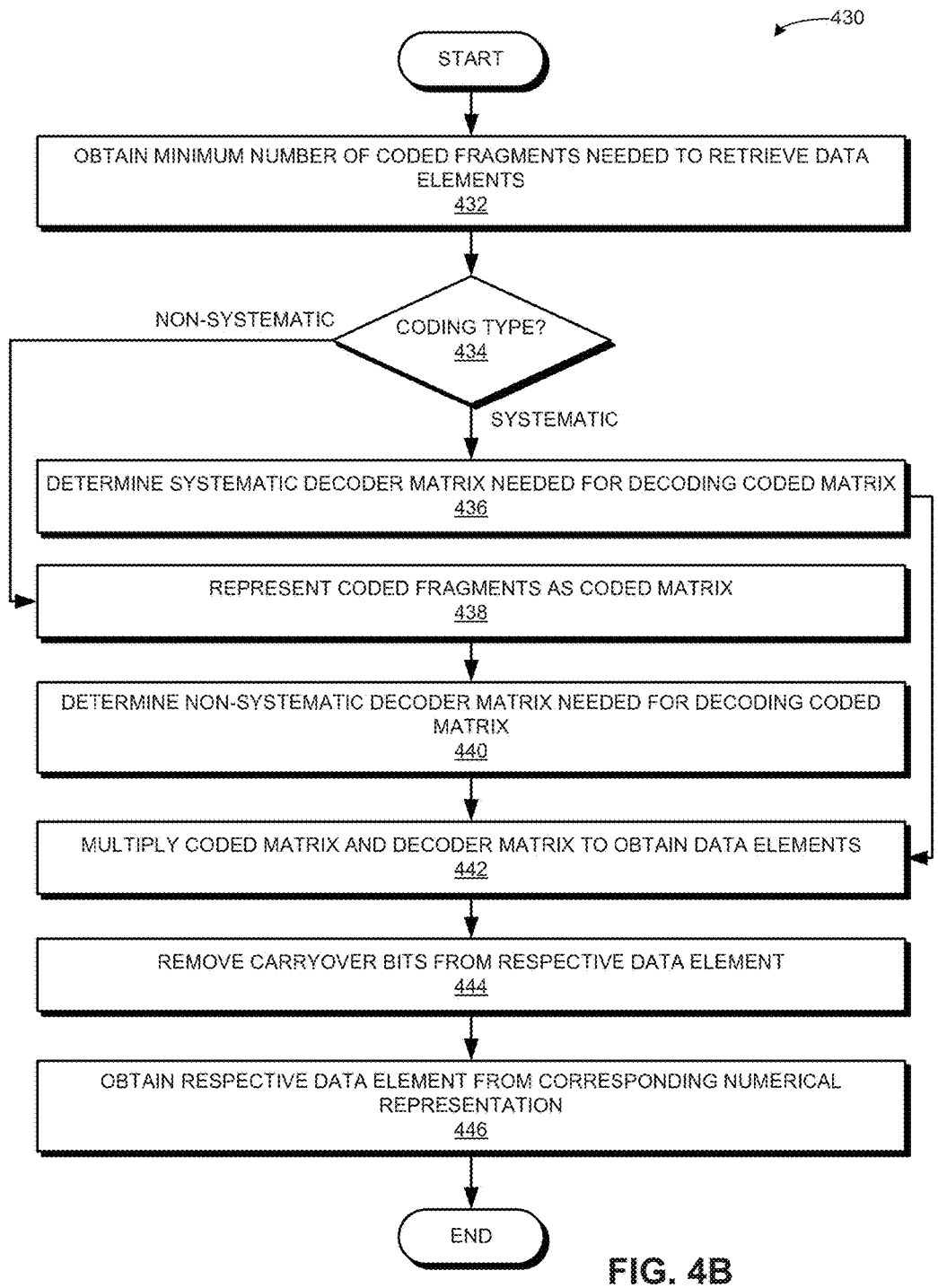
FIG. 4B presents a flowchart illustrating a method for decoding coded fragments using numerical operation-based erasure coding, in accordance with an embodiment of the present invention.

FIG. 4B presents a flowchart 430 illustrating a method for decoding coded fragments using numerical operation-based erasure coding, in accordance with an embodiment of the present invention. During operation, a storage management system obtains the minimum number of coded fragments needed to retrieve the data elements (operation 432). The system checks a coding type (operation 434). If the coding type is systematic erasure coding, the system determines a systematic decoder matrix needed for decoding the coded matrix (operation 436) and multiplies the coded matrix and decoder matrix to obtain the data elements (operation 442).

If the coding type is non-systematic erasure coding, the system represents the coded fragments as a coded matrix (operation 438), determines a non-systematic decoder matrix needed for decoding the coded matrix (operation 440), and multiplies the coded matrix and decoder matrix to obtain the data elements (operation 442). Upon obtaining the data elements, the system removes the padding bits from respective data element (operation 444) and obtains respective data element from corresponding numerical representation (operation 446).

Figure 4C:
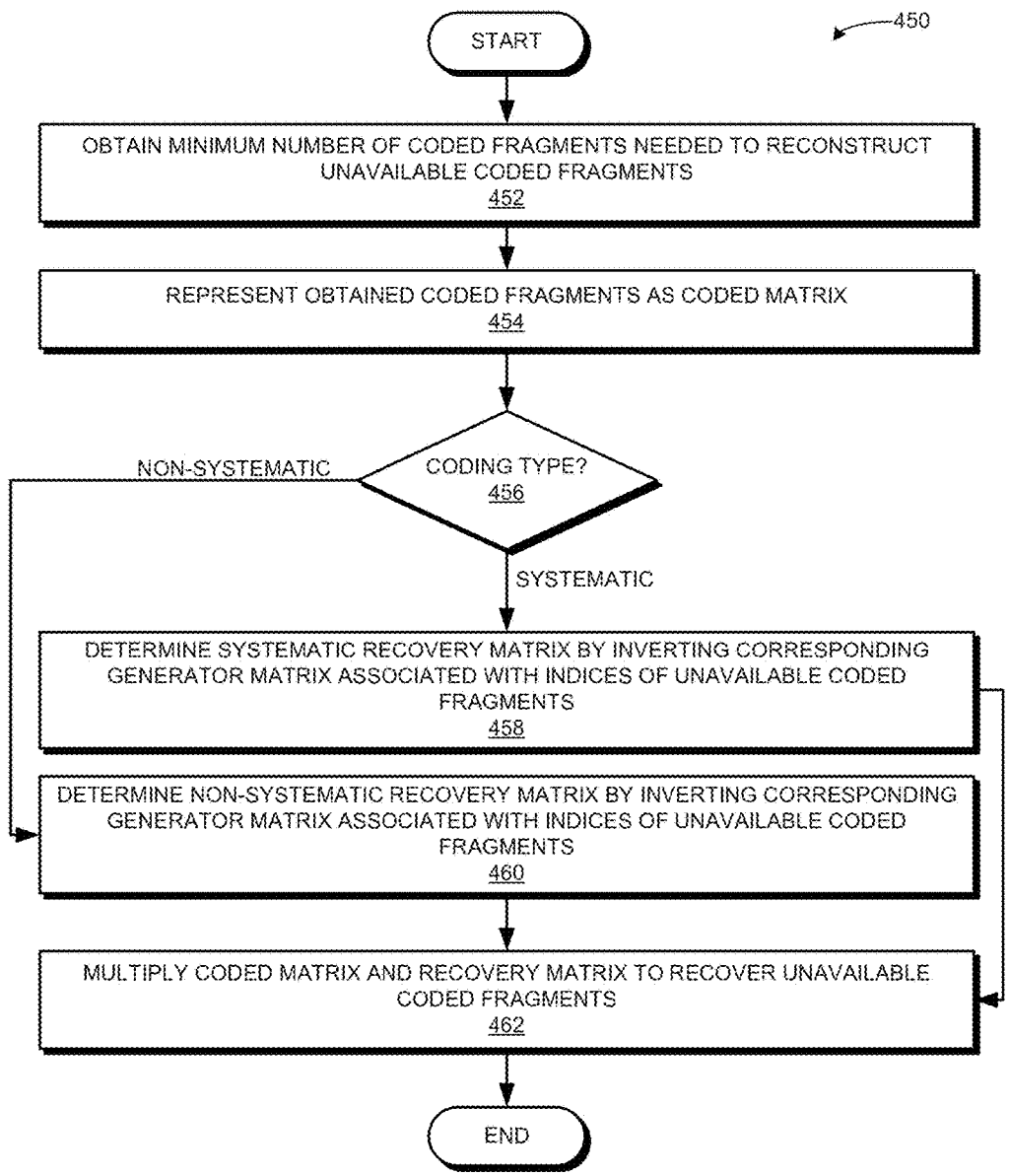
FIG. 4C presents a flowchart illustrating a method for recovering corrupted coded fragments using numerical operation-based erasure coding, in accordance with an embodiment of the present invention.

FIG. 4C presents a flowchart 450 illustrating a method for recovering corrupted coded fragments using numerical operation-based erasure coding, in accordance with an embodiment of the present invention. During operation, a storage management system obtains a minimum number of coded fragments needed to reconstruct unavailable coded fragments (operation 452) and represents the obtained coded fragments as a coded matrix (operation 454). The system checks a coding type (operation 456). If the coding type is systematic erasure coding, the system determines systematic recovery matrix by inverting corresponding generator matrix associated with indices of unavailable coded fragments (operation 458). If the coding type is non-systematic erasure coding, the system determines non-systematic recovery matrix by inverting corresponding generator matrix associated with indices of unavailable coded fragments (operation 460). The system multiplies the coded matrix and the recovery matrix to recover unavailable coded fragments (operation 462).

Figure 5:
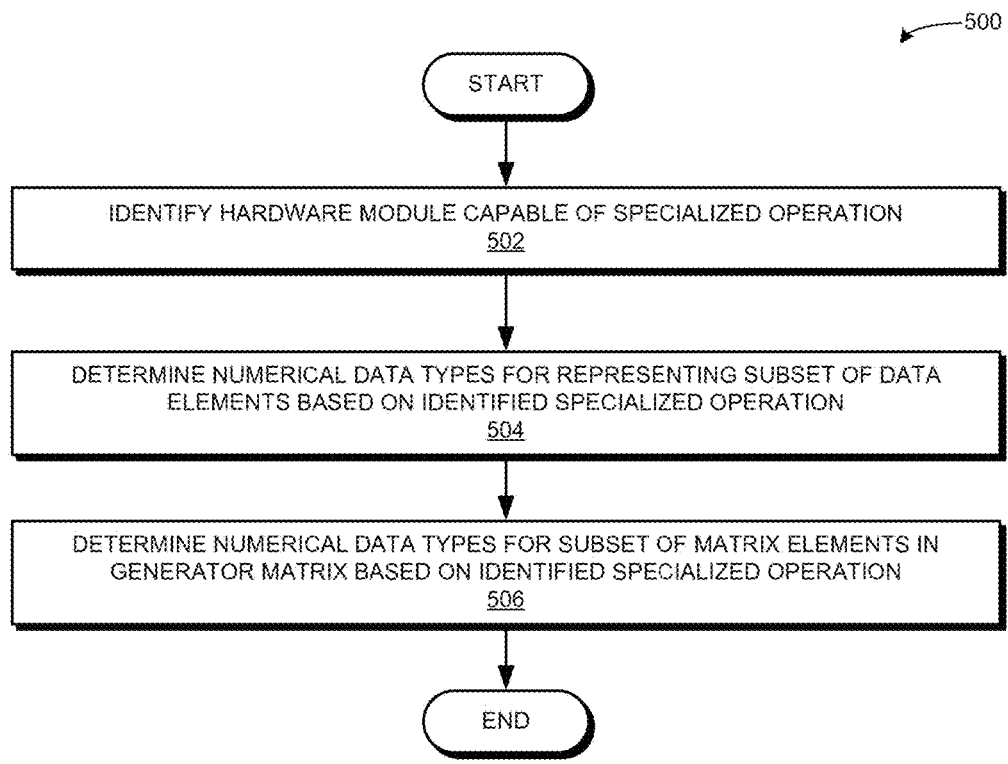
FIG. 5 presents a flowchart illustrating a method for determining numerical data types for numerical operation-based erasure coding, in accordance with an embodiment of the present invention.

FIG. 5 presents a flowchart 500 illustrating a method for determining numerical data types for numerical operation-based erasure coding, in accordance with an embodiment of the present invention. During operation, a storage management system identifies one or more hardware modules capable of a specialized operation (operation 502). The system determines numerical data types for representing a subset of the data elements based on the identified operation (operation 504). Similarly, the system determines numerical data types for representing a subset of matrix elements of the generator matrix based on the identified operation (operation 506). For example, if a computing system includes a GPU, the system identifies the GPU and its capability of processing a floating point. The system then determines the floating point as the numerical data type for representing the data elements and the matrix elements.

Exemplary Computer and Communication System

Figure 6:
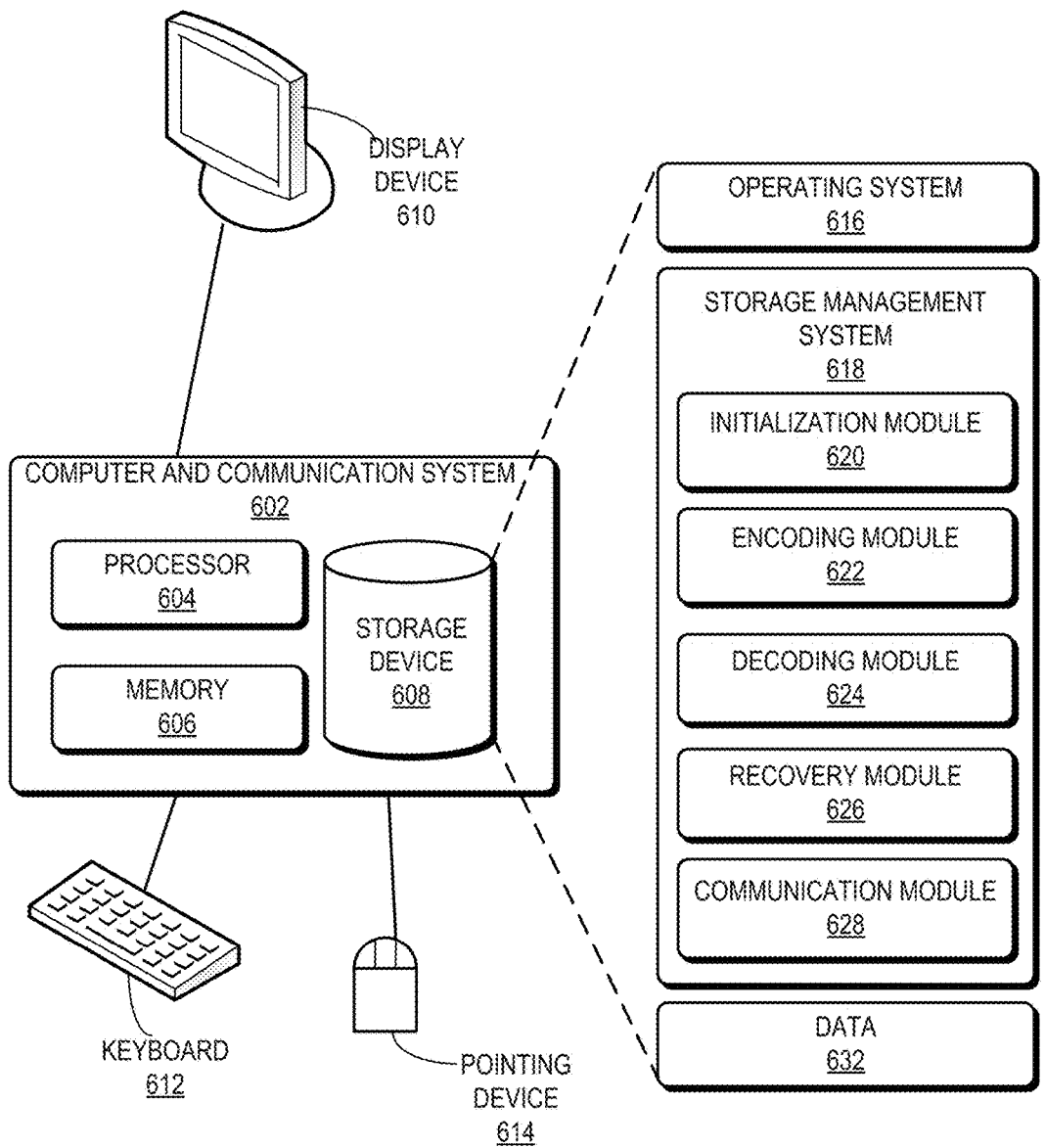
FIG. 6 illustrates an exemplary computer and communication system that facilitates numerical operation-based erasure coding, in accordance with an embodiment of the present invention.

FIG. 6 illustrates an exemplary computer and communication system that facilitates numerical operation-based erasure coding, in accordance with an embodiment of the present invention. A computer and communication system 602 includes a processor 604, a memory 606, and a storage device 608. Memory 606 can include a volatile memory (e.g., RAM) that serves as a managed memory, and can be used to store one or more memory pools. Furthermore, computer and communication system 602 can be coupled to a display device 610, a keyboard 612, and a pointing device 614. Storage device 608 can store an operating system 616, a storage management system 618, and data 632.

Storage management system 618 can include instructions, which when executed by computer and communication system 602, can cause computer and communication system 602 to perform the methods and/or processes described in this disclosure. Storage management system 618 includes instructions for determining a number of bits for representing a data element of the data stream based on the bit-width of computer and communication system 602 (initialization module 620). Storage management system 618 also includes instructions for determining dimensions of a generator matrix based on the number of data elements and the number of coded fragments to be included in a code word (initialization module 620).

Storage management system 618 further includes instructions for encoding data elements to generate coded fragments using numerical operation-based erasure coding (encoding module 622). Storage management system 618 further includes instructions for decoding coded fragments to obtain data elements using numerical operation-based erasure coding (decoding module 624). Storage management system 618 further includes instructions for recovering unavailable coded fragments using numerical operation-based erasure coding (recovery module 626). Storage management system 618 can also include instructions for exchanging information with other devices, such as distributed storage devices (communication module 628). Data 632 can include any data that is required as input or that is generated as output by the methods and/or processes described in this disclosure.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method, comprising:
   determining, by a computing system, bit-width of processing capability of the computing system;
   determining, based on the bit-width, a number of bits for representing a respective data element from a data stream;
   determining a number of data elements based on a dimension of a generator matrix of erasure encoding;

obtaining the number of data elements from the data stream, wherein a respective obtained data element is represented by the determined number of bits;

converting a respective obtained data element to a corresponding numerical representation; and generating a code word of erasure encoding from the numerical representations based on the generator matrix of the erasure encoding, wherein the code word comprises a plurality of coded fragments.

2. The method of claim 1, wherein the numerical representation and the generator matrix include one or more complex numbers in a format composed of real and imaginary parts.

3. The method of claim 1, further comprising allocating a number of padding bits of a respective data element for overflow, wherein the allocated bits are not from the data stream.

4. The method of claim 3, wherein allocating the number of bits includes:

determining a maximum of summation values of a respective row or a respective column of the generator matrix; and determining that the allocated bits can represent a value greater than or equal to the maximum of the summation values.

5. The method of claim 1, further comprising converting the numerical representation based on a computational capability of the computing system, wherein the computational capability indicates which type of numerical value the computing system is most capable of computing.

6. The method of claim 1, wherein generating the code word includes:

representing the numerical representations as a data matrix; and multiplying the data matrix with the generator matrix.

7. The method of claim 1, further comprising:

determining a sub-matrix of the generator matrix based on a minimum number of the coded fragments needed to recover the data elements;

retrieving the minimum number of coded fragments of the code word from distributed storage devices;

obtaining the numerical representations from the retrieved coded fragments based on an inverted matrix of the sub-matrix; and obtaining the data elements from the numerical representations.

8. The method of claim 7, further comprising discarding padding bits from the data elements obtained from the numerical representations.

9. The method of claim 1, further comprising:

identifying one or more of the coded fragments that are unavailable;

identifying remaining coded fragments that are available;

determining a sub-matrix of the generator matrix based on a minimum number of the remaining coded fragments needed to recover the unavailable coded fragments; and recovering, at the same time, all of the unavailable coded fragments based on an inverted matrix of the sub-matrix and indices of the unavailable coded fragments, thereby avoiding recovery of one unavailable coded fragment at a time.

10. The method of claim 1, wherein the numerical representation of a data element is obtained based on one or more of:

a frequency domain representation of the data element and a mathematical operation that associates the frequency domain representation to a function of time; and a computation of amplitude and phase of the data element.

11. A computer system for numerical operation-based erasure coding, the computer system comprising:

a processor; and a storage device storing instructions that when executed by the processor cause the processor to perform a method, the method comprising:

determining bit-width of processing capability of the computer system;

determining, based on the bit-width, a number of bits for representing a respective data element from a data stream;

determining a number of data elements based on a dimension of a generator matrix of erasure encoding;

obtaining the number of data elements from the data stream, wherein a respective obtained data element is represented by the determined number of bits;

converting a respective obtained data element to a corresponding numerical representation; and generating a code word of erasure encoding from the numerical representations based on the generator matrix of the erasure encoding, wherein the code word comprises a plurality of coded fragments.

12. The computer system of claim 11, wherein the numerical representation and the generator matrix include one or more complex numbers in a format composed of real and imaginary parts.

13. The computer system of claim 11, wherein the method further comprises allocating a number of padding bits of a respective data element for overflow, wherein the allocated bits are not from the data stream.

14. The computer system of claim 13, wherein allocating the number of bits includes:

determining a maximum of summation values of a respective row or a respective column of the generator matrix; and determining that the allocated bits can represent a value greater than or equal to the maximum of the summation values.

15. The computer system of claim 11, wherein the method further comprises converting the numerical representation based on a computational capability of the computer system, wherein the computational capability indicates which type of numerical value the computer system is most capable of computing.

16. The computer system of claim 11, wherein generating the code word includes:

representing the numerical representations as a data matrix; and multiplying the data matrix with the generator matrix.

17. The computer system of claim 11, wherein the method further comprises:

determining a sub-matrix of the generator matrix based on a minimum number of the coded fragments needed to recover the data elements;

retrieving the minimum number of coded fragments of the code word from distributed storage devices;

obtaining the numerical representations from the retrieved coded fragments based on an inverted matrix of the sub-matrix; and obtaining the data elements from the numerical representations.

18. The computer system of claim 17, wherein the method further comprises discarding padding bits from the data elements obtained from the numerical representations.

19. The computer system of claim 11, wherein the method further comprises:
- identifying one or more of the coded fragments that are unavailable;
- identifying remaining coded fragments that are available;
- determining a sub-matrix of the generator matrix based on a minimum number of the remaining coded fragments needed to recover the unavailable coded fragments; and
- recovering, at the same time, all of the unavailable coded fragments based on an inverted matrix of the sub-matrix and indices of the unavailable coded fragments, thereby avoiding recovery of one unavailable coded fragment at a time.

20. The computer system of claim 11, wherein the numerical representation of a data element is obtained based on one or more of:
- a frequency domain representation of the data element and a mathematical operation that associates the frequency domain representation to a function of time; and
- a computation of amplitude and phase of the data element.

* * * * *